United States Patent
Kwak

(10) Patent No.: US 7,463,543 B2
(45) Date of Patent: Dec. 9, 2008

(54) LOCK-OUT DEVICE AND SEMICONDUCTOR INTEGRATED CIRCUIT DEVICE INCLUDING THE SAME

(75) Inventor: Pan-Suk Kwak, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 260 days.

(21) Appl. No.: 11/243,741

(22) Filed: Oct. 5, 2005

(65) Prior Publication Data

US 2006/0142963 A1    Jun. 29, 2006

(30) Foreign Application Priority Data

Dec. 27, 2004    (KR)    ............... 10-2004-0113191

(51) Int. Cl.
*G11C 5/14*    (2006.01)
(52) U.S. Cl. ............... 365/228; 365/226; 714/14; 714/22
(58) Field of Classification Search ............ 365/185.33, 365/185.09, 226, 228; 714/14, 22
See application file for complete search history.

(56) References Cited

U.S. PATENT DOCUMENTS

| | | | |
|---|---|---|---|
| 5,594,686 A * | 1/1997 | Hazen et al. | ............ 365/185.04 |
| 5,664,089 A * | 9/1997 | Byers et al. | ................... 714/14 |
| 5,822,246 A | 10/1998 | Taub et al. | |
| 5,896,338 A * | 4/1999 | Landgraf et al. | ............ 365/226 |
| 6,556,478 B2 | 4/2003 | Willis et al. | |
| 6,629,047 B1 | 9/2003 | Guliani et al. | |
| 6,789,027 B2 | 9/2004 | Guliani et al. | |

FOREIGN PATENT DOCUMENTS

| | | |
|---|---|---|
| JP | 05-020863 | 1/1993 |
| JP | 10-134558 | 5/1998 |
| JP | 11-003586 | 1/1999 |
| KR | 1020020091677 A | 12/2002 |

OTHER PUBLICATIONS

Korean Intellectual Property Office, "Notice to File a Response/Amendment to the Examination Report" corresponding to Korean Patent Application No. 10-2004-0113191, mailed Apr. 12, 2006.

* cited by examiner

*Primary Examiner*—Van Thu Nguyen
(74) *Attorney, Agent, or Firm*—Myers Bigel Sibley & Sajovec, P.A.

(57) ABSTRACT

A lock-out device is provided that determines whether to lock out a chip or not according to the result of operation voltage drop detected at a plurality of positions in a semiconductor integrated circuit device. As a result, unnecessary lock-out operations can be prevented and a program operation or an erase operation in a semiconductor memory device can be executed stably.

10 Claims, 2 Drawing Sheets

LOCK-OUT DEVICE AND SEMICONDUCTOR INTEGRATED CIRCUIT DEVICE INCLUDING THE SAME

RELATED APPLICATION

The present application claims priority from Korean Patent Application No. 2004-113191, filed Dec. 27, 2004, the disclosure of which is incorporated herein by reference in its entirety.

FIELD OF THE INVENTION

The present invention relates to a semiconductor integrated circuit device, and more particularly, to a lock-out device of a semiconductor integrated circuit.

BACKGROUND OF THE INVENTION

Electronic devices, especially portable electronic devices, typically utilize low operation voltage in order to reduce heat generation and power consumption. Increasingly, portable electronic devices are combining traditional functions with additional functions. For example, some portable phones include a camera function for still images and a camcorder function for moving images. High capacity storage is typically required in such electronic devices in order to smoothly process both the traditional and additional functions.

As is well known, NAND flash memory is suitable for a portable electronic device as a high capacity storage. As such, NAND flash memory is traditionally packaged into a detachable card that can be inserted into or detached from a portable electronic device according to user's demand. For example, a detachable card such as a multi-media card (MMC), a secure-digital card (SD card), a smart-media card and a compact-flash card can be used as storage for voice, image and data in a digital camera, an MP3 player, a PDA, a handheld PC, a video game, a fax, a scanner, a printer, etc.

Detachable cards used as portable storage devices can encounter various operating situations. For example, a detachable card can be used in an electronic device operating at an operation voltage (VDD) of 3.3V. A detachable card can be used in an electronic device operating at a voltage lower than the operation voltage (VDD) of 3.3V. The normal operation of a card cannot be guaranteed when a card operating at the operation voltage (VDD) of 3.3V is used in a portable electronic device operating at a low operation voltage. A card designed to operate with the operation voltage (VDD) of 3.3V can deteriorate the low voltage characteristic.

Accordingly, a lock-out device is used to preserve the low voltage characteristic of electronic devices. The lock-out device terminates a mode in operation and executes a mode recovery when the operation voltage (VDD) becomes lower than a predetermined voltage level. A lock-out device and a system equipped with such a lock-out device are disclosed in U.S. Pat. No. 6,434,653, issued on Aug. 13, 2002 to Winston, entitled "METHOD AND APPARATUS FOR DISABLING POWER-ON IN A SYSTEM REQUIRING ADD-IN MODULES". As is well known to those skilled in the art, a lock-out device is generally applied to a detachable card system, a single-chip type flash-memory device and various types of semiconductor devices equipped with flash memory. Moreover, a lock-out device is applied to not only the flash memory but also to the integrated circuit device equipped with various types of memory devices.

FIG. 1 is a timing diagram of a lock-out device and exemplifies the operation of a flash memory operating at a high voltage.

In FIG. 1, the lock-out circuit produces a lock-out control signal activated to a high level when the operation voltage VDD drops down below a predetermined level Vdetect by noise and so forth during the operation of an integrated circuit. The integrated circuit device terminates a program operation or an erase operation in response to the activated lock-out control signal VLKO and executes a mode recovery.

In general, one integrated circuit is equipped with one lock-out circuit. Therefore, the voltage-drop result of the operation voltage VDD detected from the lock-out circuit reflects the result of voltage drop in a partial chip rather than the result of voltage drop in an entire chip. The condition of terminating the program operation or the erase operation can be changed according to the arrangement of the lock-out circuit in a chip. For example, since only a pump circuit operates while a high voltage is set up during the program operation or the erase operation in the flash memory, the drop in some degree of the operation voltage VDD is not a great issue. Nevertheless, since the lock-out circuit arranged near the pump circuit is influenced from the operation of the pump circuit, there sometimes occurs the unnecessary termination of operation.

SUMMARY OF THE INVENTION

Embodiments of the present invention provide a device for securing a stable operation without influence from voltage drop at a semiconductor integrated circuit device and executing a lock-out operation.

According to embodiments of the present invention, a lock-out device includes: a plurality of lock-out circuits for generating lock-out signals according to levels of operation voltages detected at a plurality of positions in an integrated circuit device; and a lock-out controller for determining whether to lock out the integrated circuit device or not by combining the lock-out signals.

The lock-out controller may terminate an operation being executed in the integrated circuit device when all the operation voltages detected at the plurality of positions drop down below a predetermined level.

The lock-out controller may determine whether to lock out the integrated circuit device or not according to the result of AND operation on the lock-out signals.

The lock-out controller may terminate an operation being executed in the integrated circuit device when more than a predetermined number of the operation voltages detected at the plurality of positions drop down below a predetermined level.

The lock-out controller may determine whether to lock out the integrated circuit device or not according to the result of AND operation and OR operation on the lock-out signals.

According to another embodiment of the present invention, there is provided a semiconductor integrated circuit device that includes: a semiconductor memory for executing a program operation, an erase operation and a read operation by producing operation voltage internally according to a voltage applied from an external circuit; and a lock-out device for terminating an operation of the semiconductor memory according to the voltage level detected at a plurality of positions in the semiconductor memory.

The lock-out device may include: a plurality of lock-out circuits for producing lock-out signals according to the operation voltage level detected at the plurality of positions; and a lock-out controller for determining whether to lock out the memory device or not by combining the lock-out signals.

The lock-out controller may terminate an operation being executed in the semiconductor memory when all the operation voltages detected at the plurality of positions drop down below a predetermined level.

The lock-out controller may determine whether to lock out the semiconductor memory or not according to the result of AND operation on the lock-out signals.

The lock-out controller may terminate an operation being executed in the semiconductor memory when more than a predetermined number among the operation voltages detected at the plurality of positions drop down below a predetermined level.

The lock-out controller may determine whether to lock out the semiconductor memory or not according to the result of AND operation and OR operation on the lock-out signals.

The lock-out controller may terminate an operation being executed in the semiconductor device when the external voltage drops down below a predetermined level.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
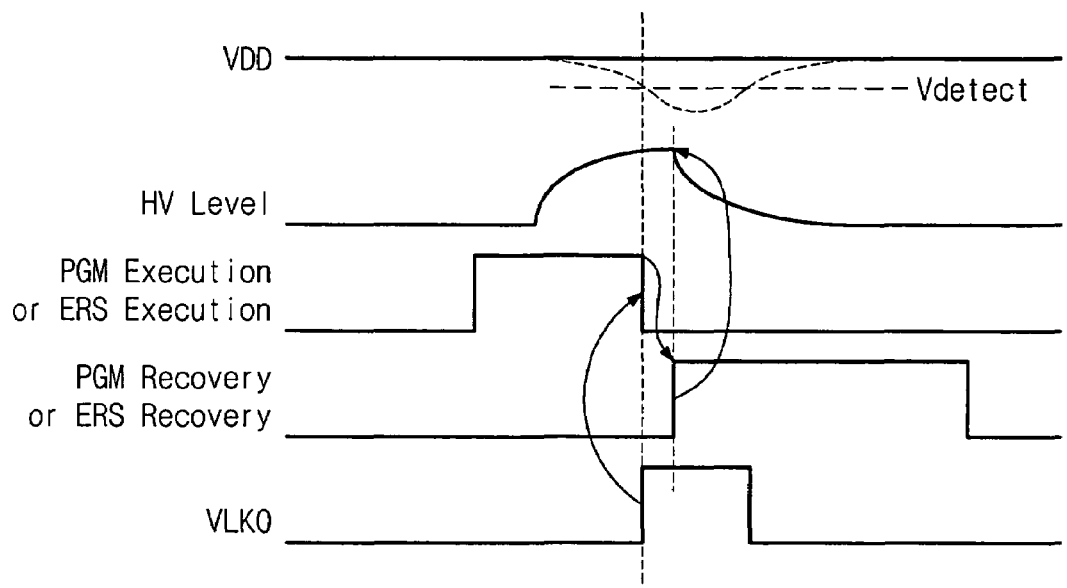
FIG. 1 is a timing diagram of a conventional lock-out circuit.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there ate no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

According to an embodiment of the present invention, a lock-out device determines whether to lock out a chip in response to the result of operation voltage drop detected at a plurality of positions in a semiconductor integrated circuit device. As a result, unnecessary lock-out operations can be prevented and a program operation or an erase operation in a semiconductor memory device can be executed.

It is well known to those skilled in the art that a semiconductor integrated circuit device supplied with an external power voltage (EVC) generates an internal power voltage (IVC) for the operation of an integrated circuit device. The internal power voltage (IVC) is produced considering the operation voltage (VDD) variation and a noise characteristic to drop down the external power voltage (EVC) for constantly ensuring the operation characteristic of an integrated circuit. It is hard to guarantee the operation characteristic of an integrated circuit device when the external power voltage (EVC) is lower than a predetermined voltage or the internal power voltage (EVC). Moreover, it is hard to guarantee the operation characteristic of an integrated circuit device when the operation voltage (VDD) is lower than a predetermined voltage. The operation voltage (VDD) can be changed according to the positions of a lock-out circuit arranged in an integrated circuit device. According to an embodiment of the present invention, a lock-out device 100 (FIG. 3) determines whether to lock out a chip or not according to the result of operation voltage (VDD) drop detected at a plurality of positions in an integrated circuit device.

As is well known to those skilled in the art, the lock-out device 100 can be applied to various types of semiconductor memory devices and integrated circuits equipped with semiconductor memory devices. According to an embodiment of the present invention, the method of a lock-out can be applied to the operation voltage (VDD) in a semiconductor integrated circuit device and the external power voltage (EVC) applied to a semiconductor integrated circuit device.

Figure 2:
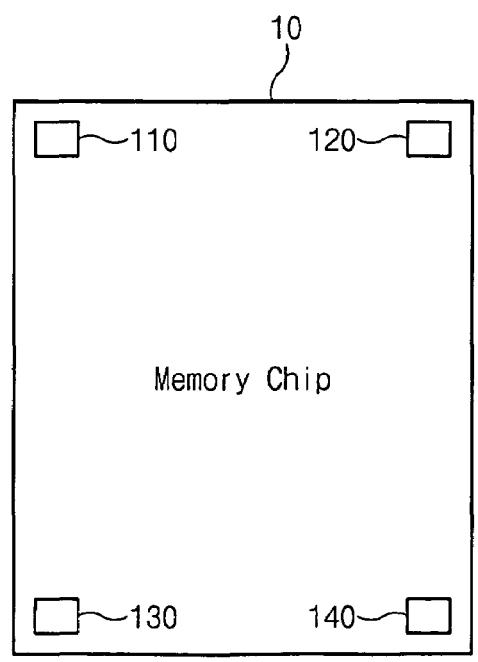
FIG. 2 is a schematic view illustrating the arrangement of a semiconductor integrated circuit device and a lock-out device according to an embodiment of the present invention.
Figure 3:
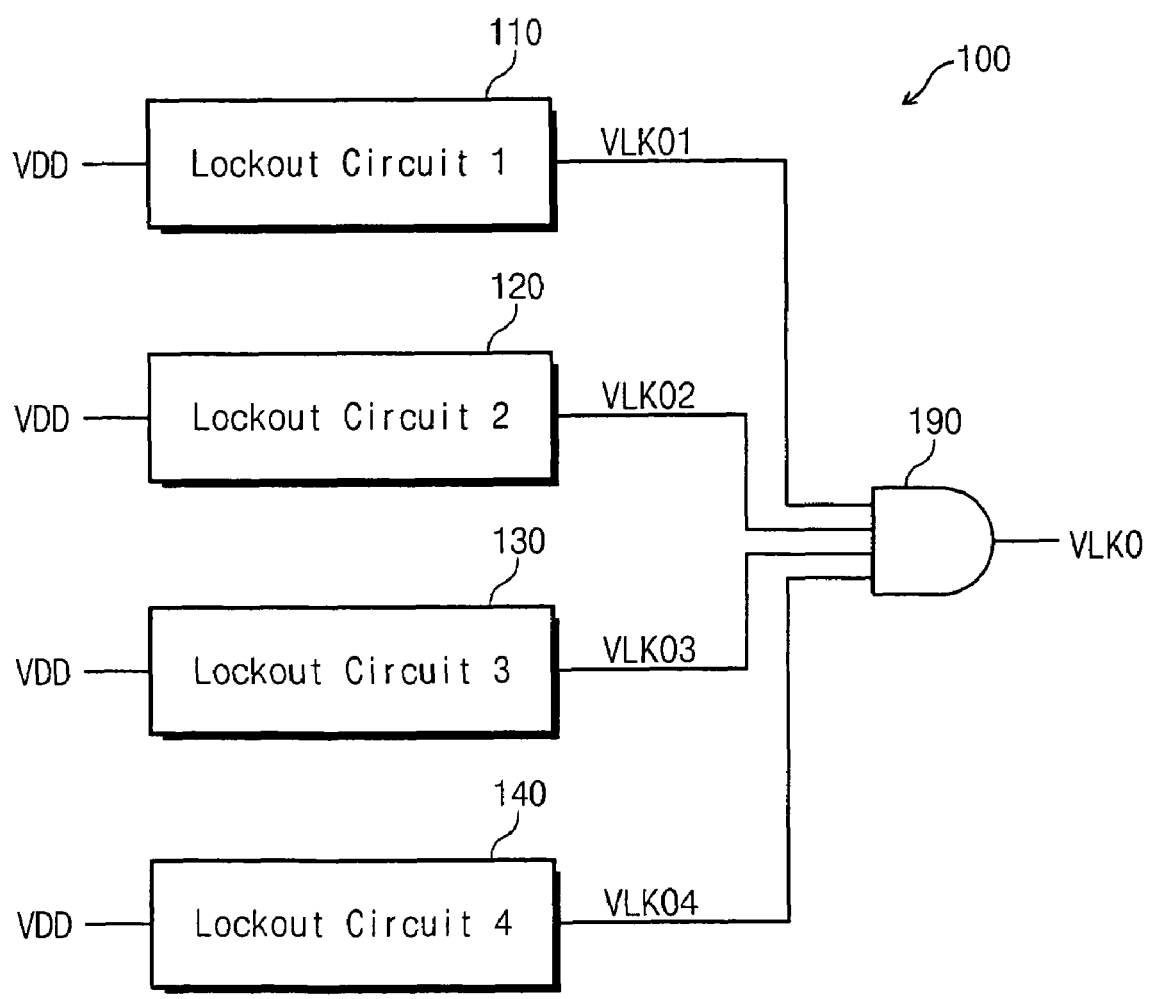
FIG. 3 is a schematic view illustrating the configuration of a lock-out device in an embodiment of the present invention.

FIG. 2 is a schematic view illustrating a semiconductor integrated circuit device 10 and the arrangement of a lock-out device according to an embodiment of the present invention. FIG. 3 is a schematic view illustrating the configuration of a lock-out device 100 according to an embodiment of the present invention. The semiconductor integrated circuit device 10 shown in FIG. 2 illustrates a chip into which at least one memory device is integrated.

Referring to FIGS. 2 and 3, the illustrated lock-out device 100 includes a plurality of lock-out circuits 110 to 140 and a lock-out controller 190. A plurality of lock-out circuits 110 to 140 are distributed and arranged in a plurality of positions on the integrated circuit.

Each of the lock-out circuits 110 to 140 detects whether the operation voltage VDD drops down below a predetermined reference voltage or not. The lock-out circuits 110 to 140 respectively produce lock-out signals VLK01 to VLK04 whenever it is detected that the operation voltage VDD drops down below the predetermined reference voltage. The lock-out controller 190 determines whether to lock out the semiconductor integrated circuit 10 by combining the lock-out signals VLK01 to VLK04 inputted from the lock-out circuits 110 to 140. The lock-out signal VLKO is selectively activated by the determination result.

The lock-out controller 190 includes an AND gate that performs a logic AND operation on the lock-out signals VLK01 to VLK04. The lock-out controller 190 generates the lock-out signal VLKO activated to a high level only when all the lock-out signals VLK01 to VLK04 are activated to a high level. Consequently, the lock-out operation cannot be executed by the operation voltage (VDD) drop generated at a part of the integrated circuit 10 and the lock-out can be executed by the operation voltage (VDD) drop over the entire integrated circuit 10. Thus, unnecessary lock-out operations are prevented and the system can be executed stably.

In addition, the lock-out circuit 100 can flexibly control the condition of the lock-out operation in the semiconductor integrated circuit 10. For example, a circuit can be configured to generate the lock-out signal VLKO activated to a high level when more than the predetermined number of the lock-out signals VLK01 to VLK04 are activated to a high level. In this case, after the logic OR operation on at least two lock-out signals, the lock-out controller 190 determines the logic level of the lock-out signal VLKO by the logic AND operation on the result of logic OR operation and the lock-out signals (or the result of the logic OR operation).

As described above, unnecessary lock-out operations can be prevented because the lock-out device determines whether to lock out the chip or not according to the result of operation voltage drop detected at a plurality of positions in the chip. Accordingly, the program operation or the erase operation in the semiconductor memory device can be executed stably.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. The invention is defined by the following claims, with equivalents of the claims to be included therein.

What is claimed is:

1. A lock-out device, comprising:
   a plurality of lock-out circuits that generate lock-out signals according to levels of operation voltages detected at a plurality of positions in an integrated circuit device; and
   a lock-out controller that determines whether to lock out the integrated circuit device or not by combining the plurality of generated lock-out signals, wherein the lock-out controller determines whether to lock out the integrated circuit device or not according to the result of AND operation on the lock-out signals.

2. The lock-out device of claim 1, wherein the lock-out controller terminates an operation being executed in the integrated circuit device when all the operation voltages detected at the plurality of positions drop down below a predetermined level.

3. A semiconductor integrated circuit device, comprising:
   a semiconductor memory that executes a program operation, an erase operation and a read operation by producing operation voltage internally according to a voltage applied from an external circuit; and
   a lock-out device that terminates an operation of the semiconductor memory according to the voltage level detected at a plurality of positions in the semiconductor memory, wherein the lock-out controller terminates an operation being executed in the semiconductor memory when all the operation voltages detected at the plurality of positions drop down below a predetermined level, and wherein the lock-out controller determines whether to lock out the semiconductor memory or not according to the result of AND operation on the lock-out signals.

4. The semiconductor integrated circuit device of claim 3, wherein the lock-out device comprises:
   a plurality of lock-out circuits that produce lock-out signals according to the operation voltage level detected at the plurality of positions; and
   a lock-out controller that determines whether to lock out the memory device or not by combining the lock-out signals.

5. The semiconductor integrated circuit device of claim 3, wherein the lock-out controller terminates an operation being executed in the semiconductor device when the external voltage drops down below a predetermined level.

6. A lock-out device, comprising:
a plurality of lock-out circuits that generate lock-out signals according to levels of operation voltages detected at a plurality of positions in an integrated circuit device; and
a lock-out controller that determines whether to lock out the integrated circuit device or not by combining the plurality of generated lock-out signals, wherein the lock-out controller terminates an operation being executed in the integrated circuit device when more than a predetermined number of the operation voltages detected at the plurality of positions drop down below a predetermined level, and wherein the lock-out controller determines whether to lock out the integrated circuit device or not according to the result of AND operation and OR operation on the lock-out signals.

7. The lock-out device of claim 6, wherein the lock-out controller terminates an operation being executed in the integrated circuit device when all the operation voltages detected at the plurality of positions drop down below a predetermined level.

8. A semiconductor integrated circuit device, comprising:
a semiconductor memory that executes a program operation, an erase operation and a read operation by producing operation voltage internally according to a voltage applied from an external circuit; and
a lock-out device that terminates an operation of the semiconductor memory according to the voltage level detected at a plurality of positions in the semiconductor memory, wherein the lock-out controller terminates an operation being executed in the semiconductor memory when more than a predetermined number among the operation voltages detected at the plurality of positions drop down below a predetermined level, and wherein the lock-out controller determines whether to lock out the semiconductor memory or not according to the result of AND operation and OR operation on the lock-out signals.

9. The semiconductor integrated circuit device of claim 8, wherein the lock-out device comprises:
a plurality of lock-out circuits that produce lock-out signals according to the operation voltage level detected at the plurality of positions; and
a lock-out controller that determines whether to lock out the memory device or not by combining the lock-out signals.

10. The semiconductor integrated circuit device of claim 8, wherein the lock-out controller terminates an operation being executed in the semiconductor memory when all the operation voltages detected at the plurality of positions drop down below a predetermined level.

* * * * *